United States Patent [19]
Kirihata et al.

[11] Patent Number: 5,970,000
[45] Date of Patent: Oct. 19, 1999

[54] REPAIRABLE SEMICONDUCTOR INTEGRATED CIRCUIT MEMORY BY SELECTIVE ASSIGNMENT OF GROUPS OF REDUNDANCY ELEMENTS TO DOMAINS

[75] Inventors: Toshiaki Kirihata, Poughkeepsie, N.Y.; Karl-Peter Pfefferl, Hohenkirchen, Germany

[73] Assignee: International Business Machines Corporation, Armonk, N.Y.

[21] Appl. No.: 09/017,019

[22] Filed: Feb. 2, 1998

[51] Int. Cl.⁶ .................................................... G11C 7/00
[52] U.S. Cl. ............... 365/200; 365/230.03; 365/185.09; 365/185.11
[58] Field of Search ............... 365/200, 230.03, 365/185.09, 185.11

[56] References Cited

U.S. PATENT DOCUMENTS

| | | | |
|---|---|---|---|
| 5,295,101 | 3/1994 | Stephen et al. | 365/200 |
| 5,422,850 | 6/1995 | Sukegawa et al. | 365/200 |
| 5,430,679 | 7/1995 | Hiltebeitel et al. | 365/200 |
| 5,457,655 | 10/1995 | Savignac et al. | 365/200 |
| 5,459,690 | 10/1995 | Rieger et al. | 365/200 |
| 5,461,587 | 10/1995 | Oh | 365/200 |
| 5,475,648 | 12/1995 | Fujiwara | 365/230.06 |
| 5,487,040 | 1/1996 | Sukegawa et al. | 365/200 |
| 5,491,664 | 2/1996 | Phelan | 365/200 |
| 5,715,202 | 2/1998 | Harima | 365/200 |

OTHER PUBLICATIONS

H. L. Kalter, et al, "A 50–ns 16–Mb DRAM with a 10–ns Data Rate and On–Chip ECC" IEEE Journal of Solid–State Circuits, V. 25, Oct. 1990, pp. 1118–1128.

T. Kirihata, et al, "A 14–ns 4–Mb CMOS DRAM with 300–mW Active Power" IEEE Journal of Solid–State Circuits, V. 27, Sep. 1992, pp. 1222–1228.

T. Sugibayashi, et al, "A 30ns 256Mb DTAM with a Multi–Divided Array Structure" IEEE Journal of Solid–State Circuits, V. 28, Nov. 1993, pp. 1092–1098.

T. Kirihata, et al, "Fault–Tolerant Designs for 256 Mb DRAM" IEEE Journal of Solid–State Circuits, V. 31, Apr. 1996, pp. 558–566.

*Primary Examiner*—David Nelms
*Assistant Examiner*—Vanthu Nguyen
*Attorney, Agent, or Firm*—H. Daniel Schnurmann

[57] ABSTRACT

A method and apparatus for repairing a memory device through a selective domain redundancy replacement (SDRR) arrangement, following the manufacture and test of the memory device. A redundancy array supporting the primary arrays forming the memory includes a plurality of redundancy groups, at least one of which contains two redundancy units. A redundancy replacement is hierarchically realized by a domain that includes a faulty element within the redundancy group, and by a redundancy unit that repairs the fault within the selected domain. SDRR allows a domain to customize the optimum number and size redundancy units according to existing fault distributions, while achieving a substantially saving in real estate, particularly over the conventional flexible redundancy replacement, in term of the number of fuses (10–20%). By combining several types of redundancy groups, each having a different number of redundancy elements, full flexible redundancy replacement can also be achieved. Consequently, this approach compensates for the drawback of existing intra-block replacements, flexible redundancy replacements, and variable domain redundancy replacements, while improving repairability irrespective of the fault distribution within the memory device.

32 Claims, 9 Drawing Sheets

○ GOOD ELEMENT (GOOD REDUNDANCY ELEMENT RE)
× DEFECTIVE ELEMENT
( UNIT: ELEMENTS REPLACED WITH REDUNDANCY UNIT (RU CONTAINING 2REs) SIMULTANEOUSLY

○ GOOD ELEMENT (GOOD REDUNDANCY ELEMENT RE)
✕ DEFECTIVE ELEMENT
( UNIT: ELEMENTS REPLACED WITH REDUNDANCY UNIT (RU CONTAINING 2REs) SIMULTANEOUSLY

REPAIRABLE SEMICONDUCTOR INTEGRATED CIRCUIT MEMORY BY SELECTIVE ASSIGNMENT OF GROUPS OF REDUNDANCY ELEMENTS TO DOMAINS

FIELD OF THE INVENTION

This invention generally relates to the field of semiconductor integrated circuit memory devices, and more particularly to a method and apparatus for repairing a memory device by a selective assignment of redundancy groups to domains to replace faults within the memory following manufacturing and test.

BACKGROUND OF THE INVENTION

CMOS technology has evolved such that the computer market has rapidly opened to a wide range of consumers. Today's multi-media requires at least 16 MB and preferably even 32 MB memories, which increases the relative cost of the memory system within a computer. In the near future, it is likely that computers having 64 MB and 128 MB memory will become commonplace, suggesting a potential demand for 256 Mb DRAMs and beyond. In spite of the ever increasing array sizes and lithographic difficulties that ensue, it is more important than ever to increase the yield of the semiconductor memory manufacturing process. Process engineers are constantly attempting to reduce and ultimately, eliminate or at least, mask defects. Faults that inevitably remain in the chip are generally overcome using special circuit designs, and more specifically, redundancy replacement configurations.

Conventional redundancy configurations typically revolve about a Fixed Domain Redundancy Replacement (FDRR) architecture, wherein redundancy elements are used to replace defective elements within a fixed size domain for each row and column redundancy.

Various configurations within the FDRR architecture have been successfully implemented over the years. A typical FDRR configuration, which is commonly used for low density DRAMs, is shown in FIG. 1a. Therein are depicted a plurality of spares used for replacing defective elements within the fixed size domain and which are appended to each sub-array forming the memory. Each redundancy unit (RU) includes a plurality of redundancy elements (REs), (e.g., two REs per RU are illustrated therein) which are used to repair existing faults (labeled X) within the corresponding sub-array. This scheme, labeled intra-block replacement, increases the redundancy area overhead as the number of sub-arrays increases for high density memories, since each physical sub-array is a fixed domain for replacement purposes, and domains in different sub-arrays are mutually exclusive of each other. This requires at least one or preferably two RUs in each sub-array. Thus, the efficiency of the RUs is rather poor in view of its inflexibility, which reduces the chip yield substantially when faults are clustered in a given sub-array. The above mentioned concept is embodied in a configuration described in the article by T. Kirihata et al., entitled "A 14 ns 4 Mb DRAM with 300 mW Active Power", published in the IEEE Journal of Solid State Circuits, Vol. 27, pp. 1222–1228, September 1992.

Another FDRR redundancy replacement arrangement, known as a flexible redundancy replacement configuration is shown in FIG. 1b, wherein a memory is depicted having a single array to selectively replace failing elements anywhere in the memory. In this configuration, REs within the RU can repair faults (labeled X) located in any sub-array within the memory. The advantage of this arrangement over the previously described intra-block replacement is that one section, namely, a redundancy array, having a certain number of RUs may advantageously be used to service any number of sub-arrays forming the memory. This translates into a substantial saving of real estate over the previous scheme, although it requires a substantial amount of additional control circuitry, in particular, more fuses over the previous intra-block replacement, to properly service all the sub-arrays forming the memory. More details regarding the above configurations and the various trade-off may be found in an article by T. Kirihata et al., "A Fault-Tolerant Design for 256 Mb DRAMs", published in the Digest of Technical Papers of the 1995 Symposium on VLSI Circuits, pp. 107–108; in an article by T. Sugibayashi et al., "A 30 ns 256 Mb DRAM with Multi-divided Array Structure", published in the IEEE Journal of Solid State Circuits, Vol. 28, pp. 1092–1098, November 1993; and in an article by H. L. Kalter et al., "A 50 ns 16 Mb DRAM with a 10 ns Data Rate and On-Chip ECC", published in the IEEE Journal of Solid State Circuits, Vol. 25, pp. 1118–1128, October 1990.

The Variable Domain Redundancy Replacement (VDRR) is a statistical approach that reduces the total number of fuses, while keeping good repairability. Unlike FDRR, RUs are assigned to at least two variable domains, some portions of which are mutually inclusive. FIG. 1c shows a typical arrangement for the VDDR, where a domain (C) includes four domains (B), each of which is further subdivided into even smaller sub-domains (A). When 64 faults are randomly distributed in a domain (C) which includes sixteen domains (A) and four domains (B), the probability of not finding faults in domain (A) is negligibly small. Each of the domains (A) statistically has at least one fault. The probability of less than eight faults in domain (B) that includes four domains (A) is also small. Each of the domains (B) statistically has at least eight faults. These facts imply that 32 of 64 faults within domain (C) can be effectively repaired with the combination of variable domains (A) and (B), in which 1 and 4 faults are repaired, respectively. The remaining 32 of 64 faults can be repaired using a fully flexible redundancy replacement in domain (C).

This variable domain redundancy replacement substantially reduces the redundancy overhead, in particular the number of fuses, by reducing the domain size (A) over domain (B), and domain (B) over domain (C). A potential drawback, however, exists if the faults are clustered in a non-statistical distribution. By way of example, when 64 faults are clustered within a specific domain (A), no known mechanism exists to repair them. A major drawback of this technique lies in the actual assignment of valuable real estate within the integrated circuit chip to implement the plurality of variable domains A, B and C mentioned above.

More details regarding the variable domain redundancy replacement is found in U.S. patent application Ser. No. 08/895,061, entitled "Variable Domain Redundancy Replacement Configuration for a Memory Device", filed on Jul. 16, 1997, and of common assignee.

Other related redundancy configurations, including some related to the categories listed above, are described in the following references:

U.S. Pat. No. 5,491,664 to Phelan, issued Feb. 13, 1996, describes the implementation of a flexible redundancy memory block elements in a divided array architecture scheme. This configuration has both, the memory and the redundant memory blocks, coupled to a read bus to allow the redundancy memory in one memory sub-array to be shared by a second sub-array.

U.S. Pat. No. 5,475,648 to Fujiwara, issued Dec. 12, 1995, in which a memory having a redundancy configuration is described such that when an appropriate address signal agrees with the address of a defective cell, a spare cell provided by the redundant configuration is activated to replace the failing one.

U.S. Pat. No. 5,461,587 to Seung-Cheol Oh, issued Oct. 24, 1995, in which a row redundancy circuit is used in conjunction with two other spare row decoders, wherein by a judicious use of fuse boxes, signal generated by a row redundancy control circuit make it possible to replace failing rows with spare ones.

U.S. Pat. No. 5,459,690 to Rieger at al., issued Oct. 17, 1995, describes a memory with a redundant arrangement that, in the presence of normal word lines servicing defective memory cells, enables faulty memory cells to be replaced with redundant cells.

U.S. Pat. No. 5,430,679 to Hiltebeitel et al., issued Jul. 4, 1995, describes a fuse download system for programming decoders for redundancy purposes. The fuse sets can be dynamically assigned to the redundant decoders, allowing a multi-dimensional assignment of faulty rows/column within the memory.

U.S. Pat. No. 5,295,101 to Stephens, Jr. et al., issued Mar. 15, 1994, describes a two level redundancy arrangement for replacing faulty sub-arrays with appropriate redundancy elements.

Practitioners of the art will readily recognize that each of the above solutions described above suffer from a major drawback, i.e., they all require setting aside a substantial amount of chip real estate to provide the redundancies necessary to repair faults within the memory. Each of the aforementioned techniques reserves one or several blocks (or units) containing each either a fixed or a variable number of redundancy elements. Sometimes these units are assigned to each primary array in the memory, sometimes the units are not yet assigned and are clustered at the bottom of the chip, requiring in turn a substantial amount of control circuitry to manage the assignment of the units to the individual memory arrays forming the memory device. In all instances, though, these redundancy groups, units, elements, and the like are built in the IC chip alongside with the memory device(s).

Practitioners of the art will further recognize that the prior art previously discussed has been described mainly in terms of DRAMs (Dynamic Random Access Memory), although the above configurations and/or architectures are equally applicable to other types of memory devices, such as SRAMs, ROMs, EPROMs, EEPROMs, Flash RAMs, CAMs, and the like. However, in addition to memory devices, today's chips may also contain only logic, or a mixture of logic and memory (i.e., embedded arrays). Since all types of integrated circuits are constantly designed with an ever increasing density, the presence of faults is a universal problem which affects all types of integrated circuit chips: logic, memory, programmable logic arrays (PLAs), ASICs, etc.

OBJECTS OF THE INVENTION

Accordingly, it is an object of the present invention to repair defective integrated circuit semiconductor memory devices following manufacturing and test.

It is another object of the invention to repair the memory following fabrication and test of the memory device, by selectively assigning redundancy groups consisting of a plurality of redundancy units, each unit having one or several redundancy elements, wherein faulty elements are hierarchically repaired by dynamically selecting the best group (or groups) of redundancy units to replace faulty elements with redundant elements.

It is further object of the invention to hierarchically repair faults subsequent to the fabrication and test of the memory device, by organizing the memory device in a plurality of domains, each of which may be subdivided in sub-domains, and assigning groups of redundancy units containing redundancy elements to repair faults within the domain and/or sub-domains.

It is still another object of the invention to repair faults by having at least two redundancy units (RU) select a domain, each RU independently repairing the fault within the selected domain.

It is a further object of the invention to repair faults by having at least two RUs select a first sub-domain, each RU independently repairing a fault within the first sub-domain, and at least two other RUs select a second sub-domain, each RU independently repairing a fault within the second sub-domain.

It is still another object of the invention to select a domain redundancy replacement arrangement, in which at least two groups that include at least two RUs select at least two domains of different size, such that each RU within one group independently repairs a fault within the first domain, and each RU within the second group independently repairs a fault within the second domain.

It is still a further object of the invention to improve yield regardless of the presence of random or clustered faults within a given domain by providing adequate redundancies for repairing at least two domains.

It is yet another object of the invention to provide added flexibility for repairing clustered faults within a domain, while trimming the design overhead in the form of redundant control circuitry.

It is a further object of the invention to select a domain redundancy replacement configuration to replace conventional intra-block, flexible, and/or variable domain redundancies, while improving the repairability with less design overhead.

SUMMARY OF THE INVENTION

A primary aspect of the present invention is to provide a method and an apparatus for repairing a memory device after final test through the use of a selective domain redundancy replacement (SDRR) to repair existing faults, the repair of the memory occurring after manufacturing and testing of the memory device. SDRR makes it possible to hierarchically and dynamically repair faulty elements by identifying the domain having the faults, and repairing the faulty elements with appropriate groups of redundancy units.

More generally, two or more selections of hierarchical domains are possible for added flexibility. This is achieved by selecting a domain which includes at least two sub-domains, a first one which is chosen, and having the faulty element within this sub-domain repaired with corresponding redundancy elements.

A hierarchical selection makes it possible to share redundancy control circuitry, substantially reducing overhead, and in particular, the number of fuses required. It also introduces added flexibility by assigning a plurality of RUs to a domain, as a function of fault distribution.

In accordance with another aspect of the invention, there is provided a method for repairing a memory device, the memory device having a plurality of primary arrays, each of the primary memory arrays having at least two domains, the method comprising the steps of: determining after testing the memory device, the number of faults within each of the domains; providing a plurality of groups of redundancy units, the units having each at least one redundancy element; assigning at least one of the redundancy groups to at least one of the two domains; and repairing faults contained within the assigned domain with the at least one of the redundancy units within the assigned redundancy group.

In accordance with a third aspect of the invention, there is provided a method for repairing a memory device, the memory device having a plurality of primary arrays, each of the primary memory arrays having at least two domains, the method comprising the steps of: providing primary memory arrays, each of the primary memory arrays having at least two domains, each of the at least two domains including at least two sub-domains; providing redundancy groups, each of the groups having at least two sub-groups, assigning the redundancy groups to at least one of the two domains, assigning the redundancy sub-groups within the assigned redundancy group to at least one of the sub-domains contained within the assigned domain; and repairing faults contained within the assigned sub-domain with the redundancy units contained within the assigned redundancy sub-groups.

In accordance with a fourth aspect of the invention, a repairable memory device is provided with a selective domain redundancy replacement arrangement, the memory device comprising: primary memory arrays, each of the primary memory arrays having at least two domains; means for assigning redundancy groups to at least one of the two domains, each of the redundancy groups comprising a plurality of redundancy units; and means for repairing faults within the domain with the redundancy units contained within the assigned redundancy groups.

BRIEF DESCRIPTION OF THE DRAWINGS

The above-mentioned objects, aspects and advantages of this invention and the manner of attaining them will become more apparent and the invention itself will be better understood by reference to the following description of embodiments of the invention taken in conjunction with the accompany in drawings, the description of which follows.

DETAILED DESCRIPTION OF THE PREFERRED EMBODIMENTS

Whereas the present invention will be described in terms of a memory device, and more particularly, in terms of a DRAM, a similar construction can be adapted to other types of memory devices, logic and combinations thereof.

The present invention further assumes that the DRAM is built having a plurality of yet unassigned redundancy elements. These elements are assembled in units, the units in groups, etc., to service a number of as yet unrepaired and unidentified faults spread out thorough the DRAM, some of which are clustered, and some of which are randomly distributed. The determination of how many faults exist in a given memory device and their precise location is done subsequent to the fabrication and test of the memory device. At that time, a map of existing faults is drawn and a determination is made to ascertain the best combination of groups, units and elements to best and most efficiently repair the faults with the aforementioned redundancy means.

Accordingly, the following discussion assumes that a fault map has been drawn for a given DRAM, and will describe how the best assignment of redundancy means is to be applied to repair the faults contained therein.

Figure 2A:
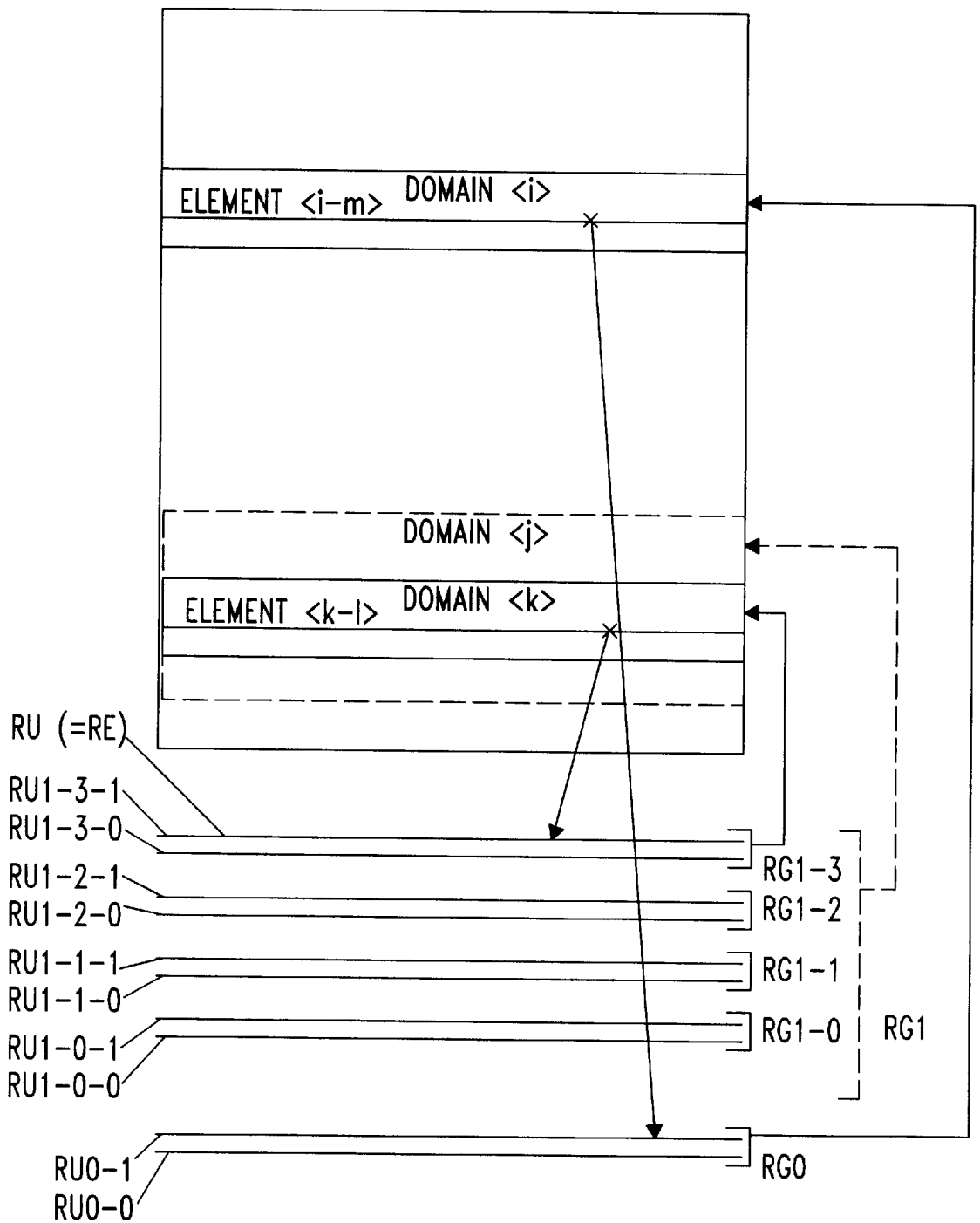
FIG. 2a illustrates how SDRR (selective domain redundancy replacement) is applied to a memory device organized in domains, and how faults are repaired using redundancy groups available for replacement, in accordance with the present invention.

FIG. 2a illustrates a preferred embodiment of SDRR in accordance with the present invention. SDRR will now be applied to the DRAM organized into several domains and containing faults located in the various domains to be replaced with redundancy groups that are available for replacement.

A faulty element <i-m> is hierarchically repaired by first selecting a domain <i> for redundancy group RG0, and then replacing the faulty element <i-m> with either replacement unit RU0-0 or RU0-1 within redundancy group RG0.

Likewise, a faulty element <j-k-l> is hierarchically repaired by first selecting a domain <j> for redundancy group RG1, by further selecting domain <j-k> for redundancy group RG1-3, and finally, by replacing the faulty element <j-k-l> with either redundancy unit RU1-3-0 or RU1-3-1.

Figure 1A:
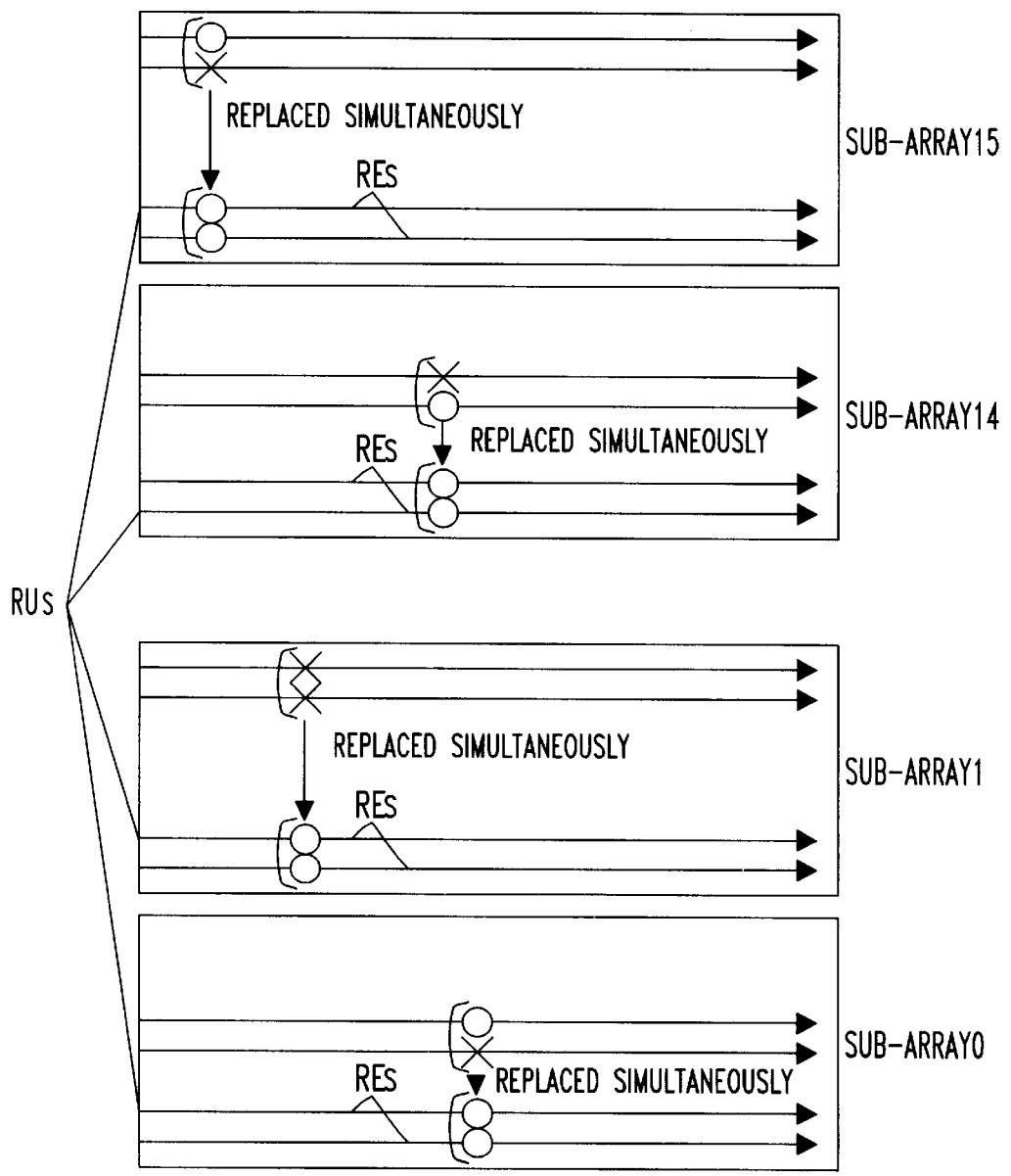
FIG. 1a shows a schematic representation of a memory provided with a conventional FDRR intra-block replacement scheme, wherein failing rows in the various sections of the memory are corrected with REs replacing failing ones in each corresponding section.
Figure 1B:
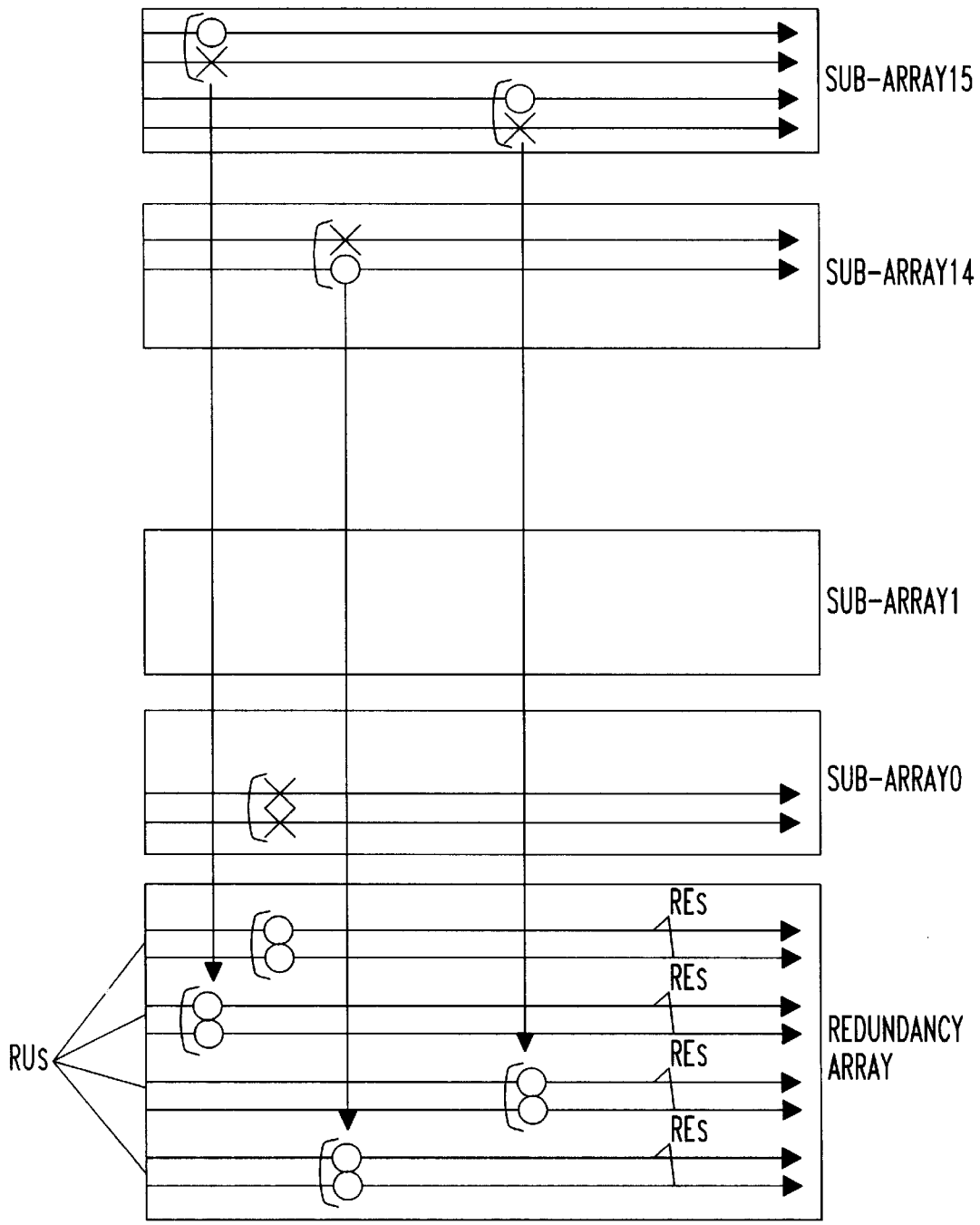
FIG. 1b shows a schematic diagram of a memory provided with a conventional FDRR flexible redundancy replacement scheme, wherein an array of REs clustered at one end of the memory is used to selectively replace failing rows anywhere within the memory.
Figure 1C:
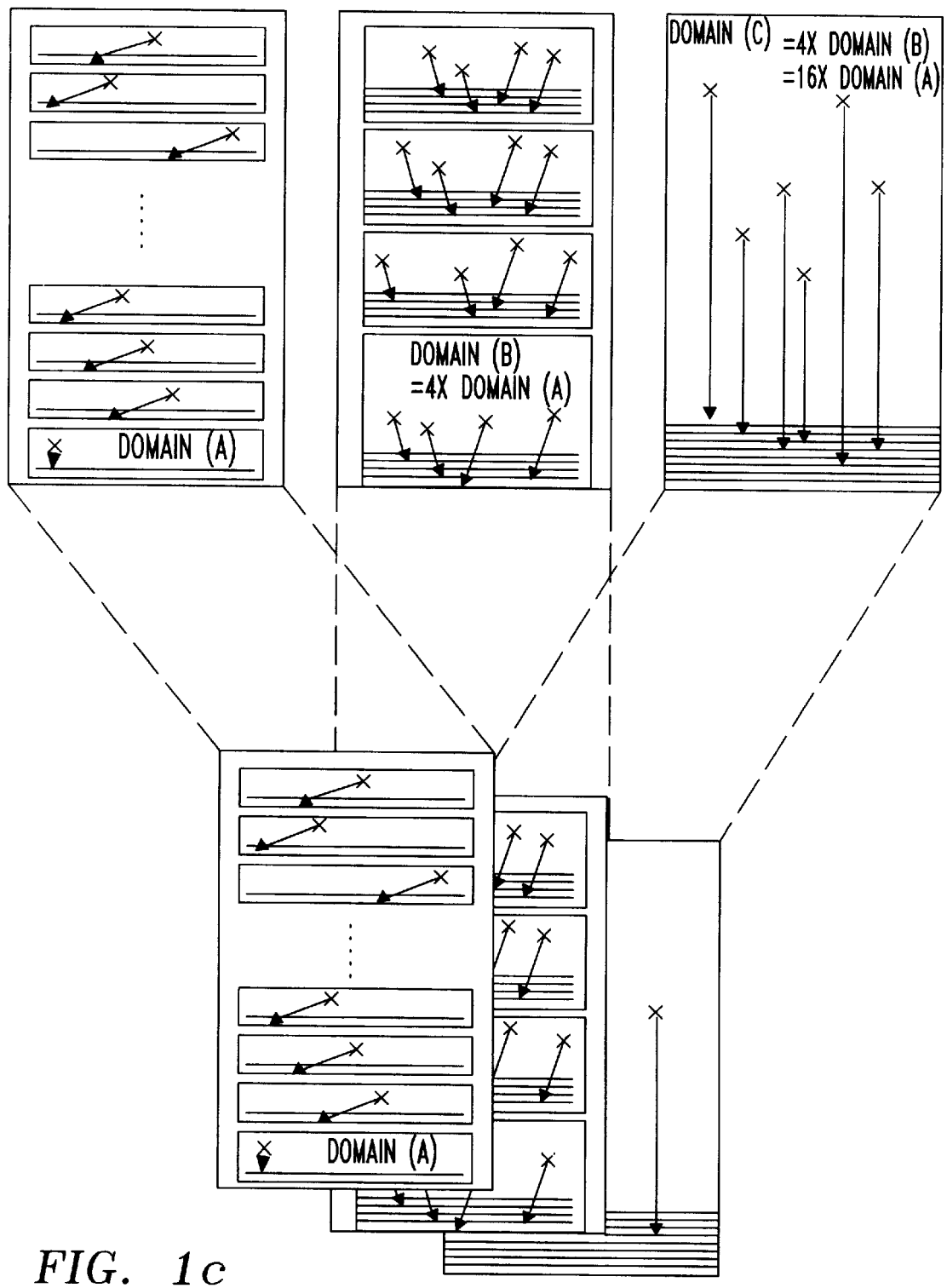
FIG. 1c is a schematic diagram of a memory provided with a conventional VDRR variable domain redundancy replacement scheme, wherein variable three domains A, B, and C, selectively replace failing rows anywhere within the corresponding domain.
Figure 2B:
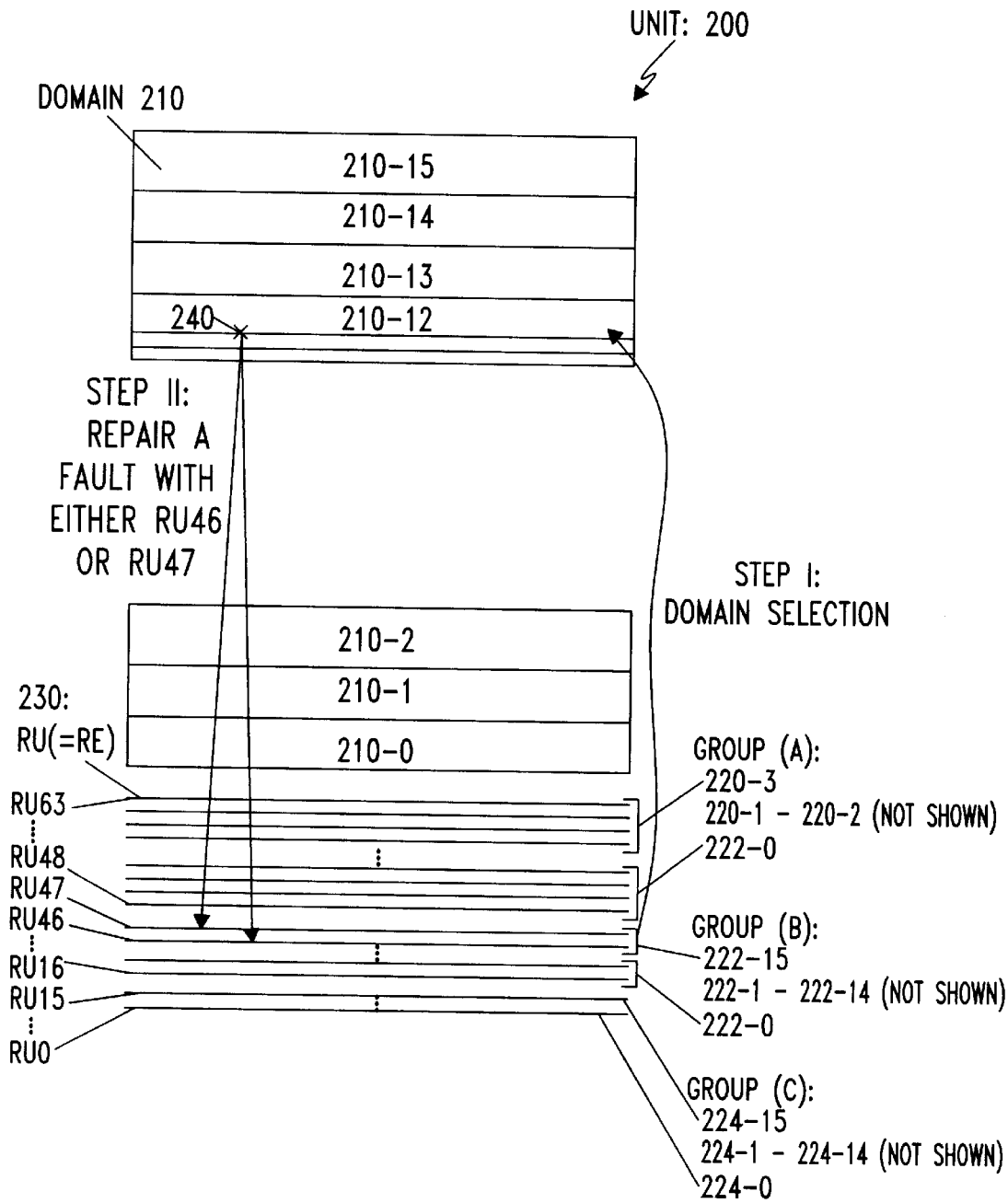
FIG. 2b shows a typical SDRR arrangement and domain assignment to enable a fully flexible redundancy replacement.

FIG. 2b shows an arrangement and domain assignment of SDRR within the framework of a fully flexible redundancy replacement configuration. Unit 200 consists of sixteen domains 210 (i.e., 210-0, . . . , 210-15) supported by 64 redundancy unit RUs 230 (i.e., RU0, . . . , RU63), each consisting of one redundancy element RE. (Alternatively, RUs can also include two or more REs, which are simultaneously replaced to make the repair). Up to 64 single element faults are to be repaired within the unit, regardless whether the faults are randomly distributed faults or clustered faults. Although a flexible redundancy replacement described above with reference to FIG. 1b can repair such faults, the SDRR technique of the present invention can accomplish it in a significantly more efficient manner. It is worth noting that the variable domain redundancy replacement previously discussed cannot achieve this goal when faults are clustered, although its effectiveness for randomly distributed faults is significantly better than that achieved by the flexible redundancy replacement technique described above.

In an SDRR configuration according to the present invention, a fault 240 is repaired following a two step process:

i) Determining how many redundancy units RUs are needed based on the number and the location of the faults, and assigning redundancy groups to the fault containing domains based on the number of RUs required to most efficiently repair the faults in each particular domain. By way of example, redundancy group 220-0, consisting of a plurality of RUs 230, is selected for one of the sixteen domains 210-0, . . . , 210-15, based on the number of faults contained in a particular domain, e.g., 210-12, within the unit 200.

ii) Repairing the fault 240 within the domain 210-12 with either RU 46 or RU 47 contained in the assigned redundancy group 222-15.

In FIG. 2b, redundancy elements are configured as four groups A (220-0, . . . , 220-3), each consisting of four RUs; sixteen groups B (222-0, . . . , 222-15), each consisting of two RUs; and sixteen groups C (224-0, . . . , 224-15), each consisting of a single RU.

The domain assignment for the various redundancy groups is as follows: faults within the first domain which have the highest number of faults are repaired with the first of the largest groups A, having each four RUs. The remaining faults of the first domain which cannot be repaired with the first of the largest groups A, are repaired with the second largest groups B, each having two RUs. All remaining faults, which cannot be repaired with the first and second largest groups A and B, are repaired with the smallest groups C, each of which is shown having one RU. All remaining faults located within the other domains are repaired in a similar manner. By following these rules, up to 64 faults within unit 200 can be repaired, irrespective of the distribution of faults.

The domain assignment will be more clearly understood using the following three examples:

EXAMPLE I

Each domain 210 (i.e., 210-0, . . . , 210-15) is assumed to contain individually four faults. Four sets of groups A are respectively assigned to domains 210-0, 210-1, 210-2, and 210-3. Since no more groups A are left, eight sets of groups B are now, respectively, assigned to domains 210-4, 210-5, 210-6, 210-7, 210-8, 210-9, 210-10, and 210-11. Since no group B redundancies remain, four sets of four groups C are now, respectively, assigned to domains 210-12, 210-13, 210-14, and 210-15.

EXAMPLE II

Domain 210-5 is assumed to contain 64 faults. All groups A 220-0, . . . , 3, groups B 222-0, . . . , 15, and groups C 224-0, . . . , 15, are assigned to domain 210-5.

EXAMPLE III

Domain 210-0 is assumed to contain 32 faults and domain 210-7 to contain 12 faults. Domains 210-10 and 210-15 are assumed to contain each 10 faults. In this case, all four groups A 220-0, . . . , 3 and eight groups B 222-0, . . . , 7, collectively including 32 redundancy elements, are assigned to domain 210-0. Six groups B 222-8, . . . , 13, collectively containing 12 redundancy elements, are assigned to domain 210-7. Two groups B 222-14,15 and six groups C 224-0, . . . , 5, collectively containing 10 redundancy elements, are assigned to domain 210-10. The remaining ten groups C 224-6, . . . , 15 are assigned to domain 210-15.

The advantage of a selective domain redundancy replacement methodology over the existing flexible redundancy replacement technique will be better understood when described in conjunction with the following example, in which 64 faults of 8192 elements in unit 200 are to be repaired, regardless of the fault distribution.

When using the flexible redundancy replacement technique, each RU requires 13 address fuses (+1 master fuse) per RU to repair any 64 faults of the 8192 elements in the unit. This requires 832 address fuses (+64 master fuses) for the 64 RUs. On the other hand, with the present SDRR invention, only 9 address fuses (+1 master fuse) are required to decode one of the 512 elements within a domain per RU, necessitating 576=9×64 address fuses for supporting all the 64 RUs. Additionally, each group requires 4 domain fuses to select 1 of 16 domains. (Note: This example has 4 groups A, 16 groups B, and 16 groups C, in 144=4×36 domain fuses, for a total of 36 groups). This requires 576 address fuses (+64 master fuses), 144 domain fuses, for a total of only 720 fuses. Thus, in this example, the invention eliminates a total of 112 fuses or a total of 9% when compared to the flexible redundancy replacement technique.

The advantage of the SDDR technique over the existing flexible redundancy replacement methodology further increases as the number of RU increases, by increasing the number of groups A in lieu of groups B and/or C. By way of example, for 128 RUs, configuring 20 groups A having each 4 RUs, 16 groups B having each 2 RUs, and 16 groups C having each 1 RU, requires 1152 address fuses (+128 master fuses) and 208 domain fuses, saving 304 fuses or 17% over the flexible redundancy replacement technique which requires 1664 address fuses (+128 master fuses).

Figure 3:
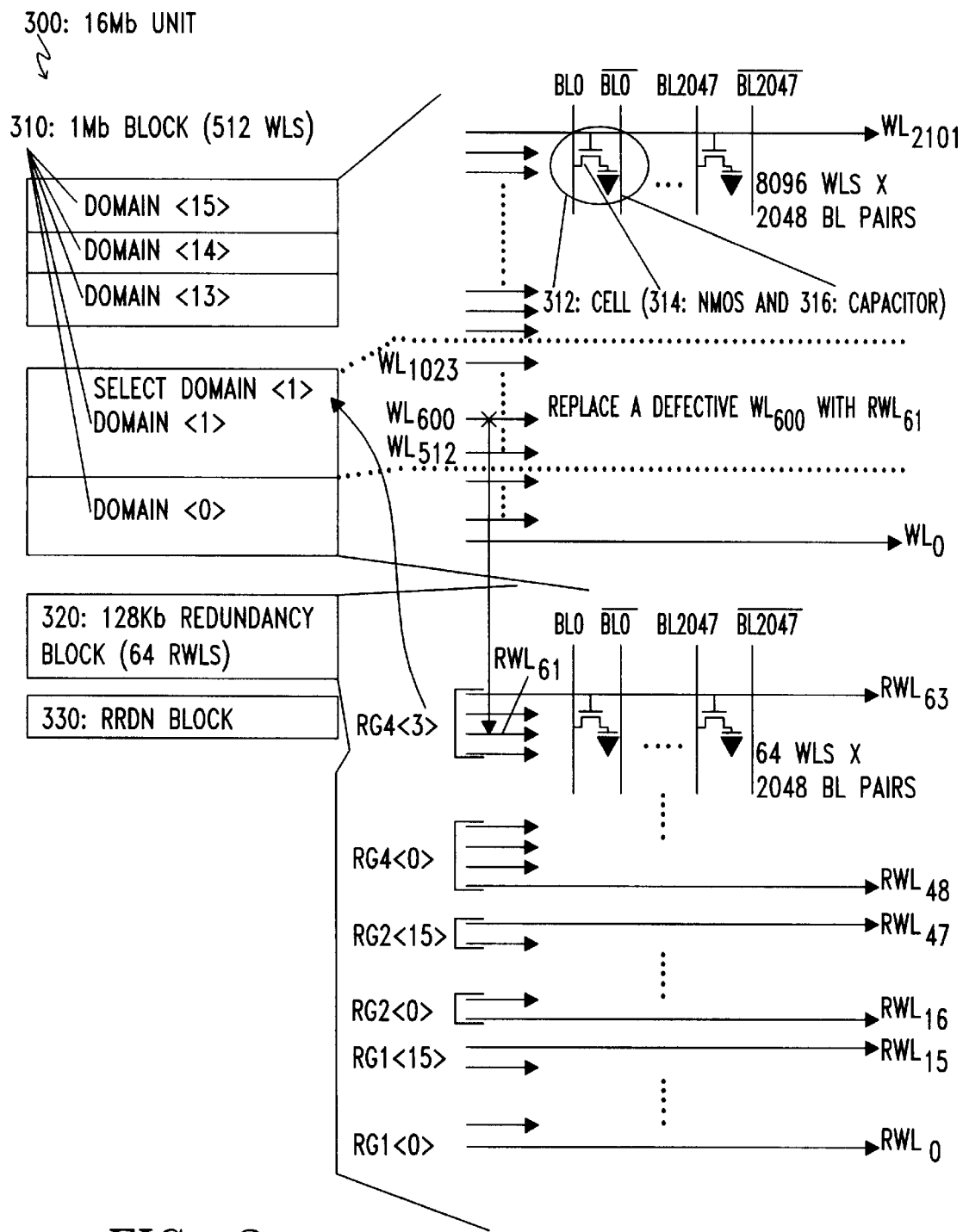
FIG. 3 shows a block diagram of a 16 Mb unit, using SDRR as the preferred embodiment.

FIG. 3 shows a block diagram of a 16 Mb unit using the selective domain redundancy replacement SDRR. The 16 Mb unit 300 consists of sixteen 1 Mb blocks 310, one 128 Kb redundancy block 320, and one row redundancy control block 330 (RRDN block). Each 1 Mb block 310 contains 512 word lines WL and 2048 bit line BL pairs. The 1 Mb block contains 1M cells 312, each consisting of one NMOS 314, and one capacitor 316. Therefore, the sixteen 1 Mb blocks contain 8192 WLs (WL0–WL8191), one of which is activated when unit 300 is activated. The 128 Kb redundancy block contains 64 redundant word lines (RWL0–RWL63) and 2048 BL pairs, containing 128 Kb redundant cells. Up to 64 faults within the sixteen 1 Mb blocks 310 are repaired with 64 RWLs (each forming a redundancy unit RU) in redundancy block 320. For simplicity sake, the following discussion assumes that a 1 Mb block is identical to a domain.

The size of the domain and the size of each RU can also be changed to achieve further flexibility in a variable domain and variable size redundancy replacement. Details of the variable domain redundancy replacement architecture and variable size redundancy replacement configuration are discussed in related U.S. patent applications Ser. Nos. 08/895, 061, pending, and 08/825,949, respectively filed Jul. 16, 1997 and Mar. 31, 1997, the latter issued as U.S. Pat. No. 5,831,914 which are incorporated herein by reference. Sixteen RWL0–15 of 64 configure sixteen repair groups-1 (RG1<0:15>), each containing signal RWL. Thirty-two RWL16–47 configure sixteen repair groups-2 (RG2<0:15>), each containing two RWLs. The remaining sixteen RWL48–63 configure four repair groups-4 (RG4<0:3>), each containing four RWLs. As previously discussed in the summary of the invention, a group containing a number of RUs selects one of sixteen domains <0:15>, in accordance with the fault distribution.

By way of example, RG4<3> is assigned to domain <1> because it contains 4 RWLs (RUs), and up to four word line faults have been identified therein. RWL61 within RG4<3> is used to repair a faulty WL600. The remaining three RWL60, RWL62, and RWL63 are used to repair three faulty WLs (not shown) within domain <1> containing WL512–1023. When four RUs within RG4<3> are inadequate to repair the domain <1>, other RGs can be assigned to domain <1>.

Figure 4:
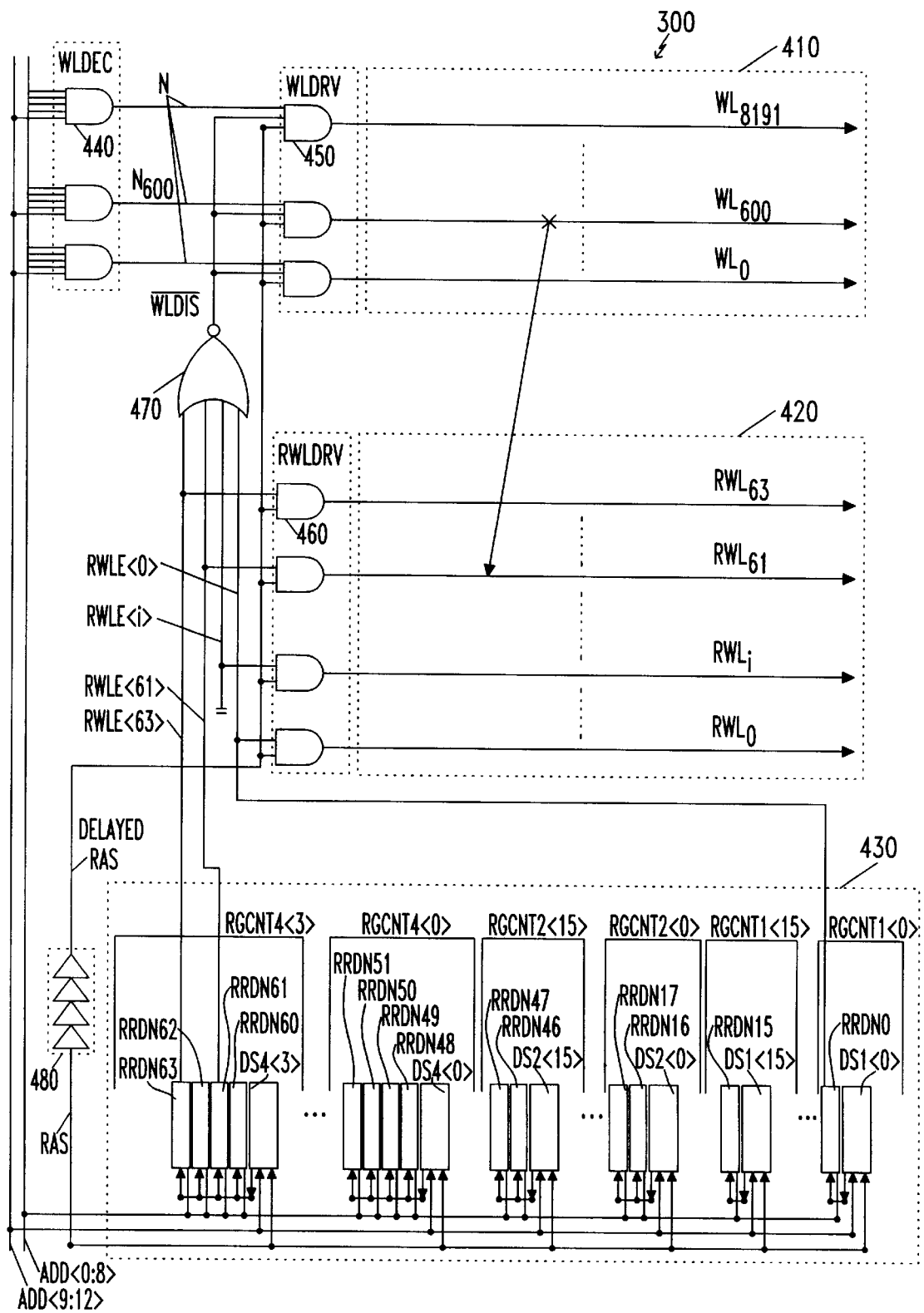
FIG. 4 shows a more detailed block diagram of the 16 Mb unit using SDRR.

FIG. 4 shows a detailed block diagram of the 16 Mb unit 300 illustrated in FIG. 3. The 16 Mb unit 300 consists of 16 Mb array 410 containing 8192 WLs, word line decoders 440 (WLDEC), word line decoder drivers 450 (WLDRV), 128 Kb redundancy array 420 containing 64 redundancy word lines RWLs, redundancy word line drivers 460 (RWLDRV), word line disable decoder 470, and RRDN block 430. When unit 300 is enabled, thirteen address lines ADD<0–12> are inputted into the unit. WLDEC, represented by AND gate 440, decodes ADD<0–12> and activates one of 8192 nodes N<0–8191>. The corresponding driver WLDRV is enabled. During the decoding operation, block RRDN initiates a redundancy match detection, which determines its mode of operation: normal or redundancy. In a normal mode, all 64 RWLs enabling signals RWLE<0–63> remain at a low. Disable circuit WLDIS remains at a high since all the 64 inputs to NOR gate 470 stand at a low. Accordingly, when the delayed RAS signal switches to a high, the corresponding WL is driven by the corresponding WLDRV, and no RWLs are activated, because all RWLEs are at a low when the delayed RAS switches to a high. When in redundancy mode, RRDN block 430 activates one of the 64 RWLE<0:63>, enabling the corresponding RWLDRV. Simultaneously, signal WLDIS bar falls when RWLE switches to a high. When the delayed signal RAS rises, a corresponding RWL is driven by the corresponding RWLDRV. No word line WL is activated, regardless of the WLDEC decoding result since signal WLDIS bar remains at a low when the delayed RAS switches to a high.

RRDN block 430 consists of sixteen redundancy group control circuits RGCNT1<0–15>, sixteen redundancy group control circuits RGCNT2<0–15>, and four redundancy group control circuits RGCNT4<0–3>. RGCNT1<0–15>, RGCNT2<0–15>, and RGCNT4<0–3> support the corresponding RG1<0–15>, RG2<0–15>, and RG4<0–3>, shown in FIG. 3, respectively. Each RGCNT1<0–15>consists of one row redundancy control circuit RRDN, and one domain select circuit DS1 (i.e., DS1<0>). Each RGCNT2<0–15>consists of two RRDNs, and one DS2 (i.e., DS2<0>). Each RGCNT4<0–3> consists of four RRDNs and one DS4 (i.e., DS4<0>). Regardless of which RGCNT is activated, whether RGCNT1, RGCNT2, or RGCNT4, both RRDN and DS are identical; only the number of RRDNs, i.e., 1, 2, and 4 for RGCNT1, RGCNT2, RGCNT4, will respectively change. The domain select circuit DS within each RGCNT select a given domain, whereas the RUs within the RG is flexibly controlled by the independently controllable RRDNs within each RGCNT. The detailed schematic and operation of the RGCNT are discussed next.

Figure 5:
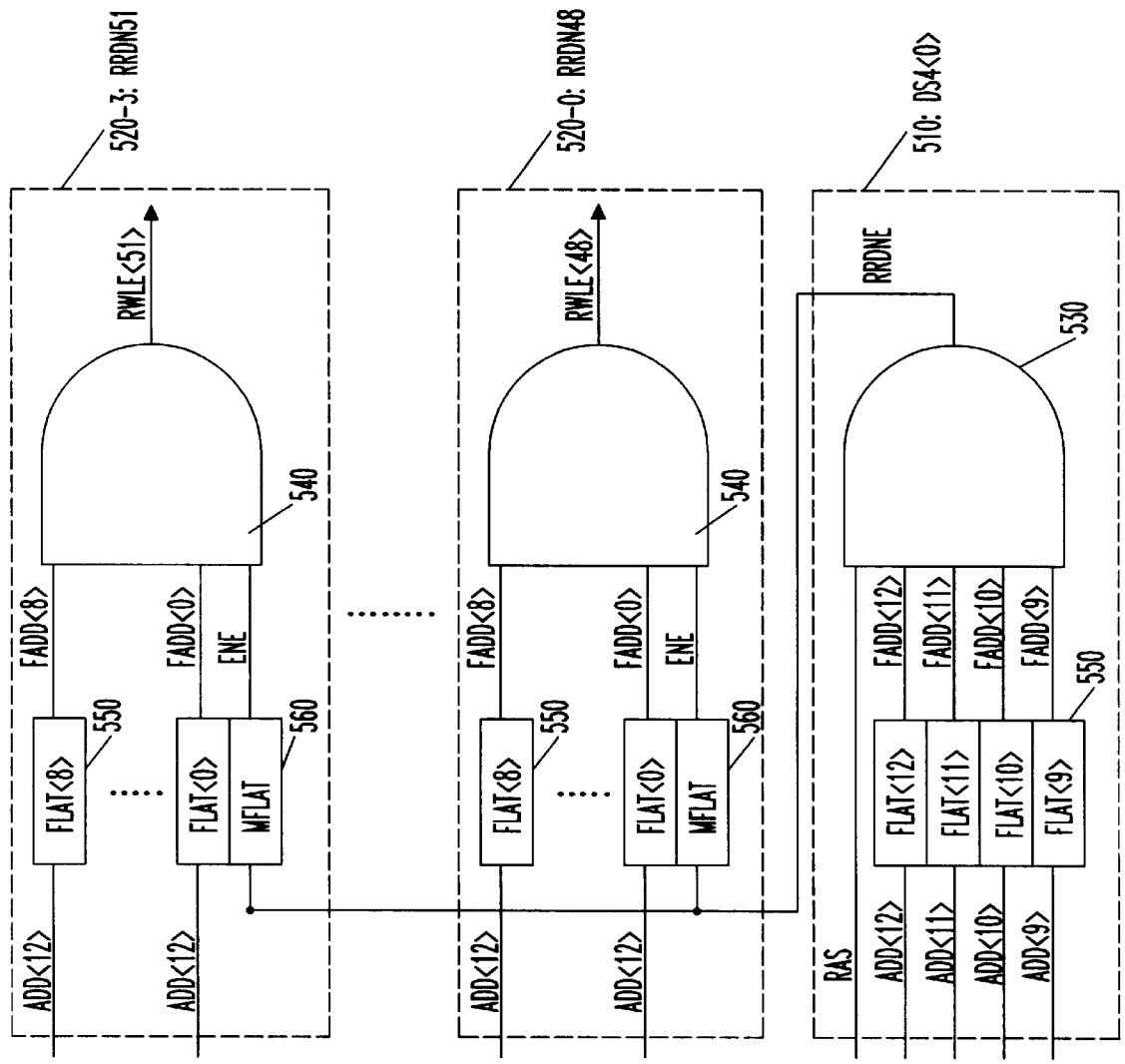
FIG. 5 is a detailed schematic of a redundancy group control circuitry RGCNT4<0> for the 16 Mb unit shown in FIG. 4.

FIG. 5 shows a detailed schematic of RGCNT4<0> shown in FIG. 4. As discussed previously, RGCNT4<0> consists of one domain select circuit DS4<0> 510 and four redundancy control circuits RRDN48 (520-0), RRDN49 (not shown), RRDN50 (not shown), and RRDN51 (520-3). DS4<0> consists of four fuse latches 550 labeled as FLAT<9–12>, in addition to AND gate 530. Each FLAT compares the corresponding address input ADD with pre-programmed address inputs (not shown), activating the corresponding signal FADD. When no match occurs, the signal FADD remains at a low. When they match, signal FADD switches to a high. When all four FADD<9:12>, i.e., the address for selecting 1 of 16 domains within the unit switch to a high, redundancy enable signal RRDNE is activated when the signal RAS switches to a high. Each RRDN consists of nine FLAT<0–8>550, each of which is identical to FLAT for domain select circuit DS4<0>; one master fuse latch MFLAT 560; and one AND gate 540. All FLATs are identical to those described with reference to DS4<0>. Note that the RRDNE generated in DS4<0> (510) is coupled to the master fuse latch MFLAT 560 in each RRDN 540.

As it was previously discussed for DS4<0>, each FLAT compares the corresponding address input ADD with pre-programmed address inputs (not shown), activating the corresponding signal FADD. When no match occurs, the signal FADD remains at a low. When they match, the signal FADD switches to a high. MFLAT output signal ENE remains at a low as long as the master fuse is not blown. When it is blown, the signal ENE follows the state of the signal RRDNE. Only when the signal ENE, which is enabled when the domain is selected, and the four FADD<0–8>, which perform the element selection within the domain, switch to a high, the corresponding signal RWLE turns on. Switching to a high allows RWLE to activate the corresponding RWL while disabling the WL selection, as discussed previously.

Figure 6:
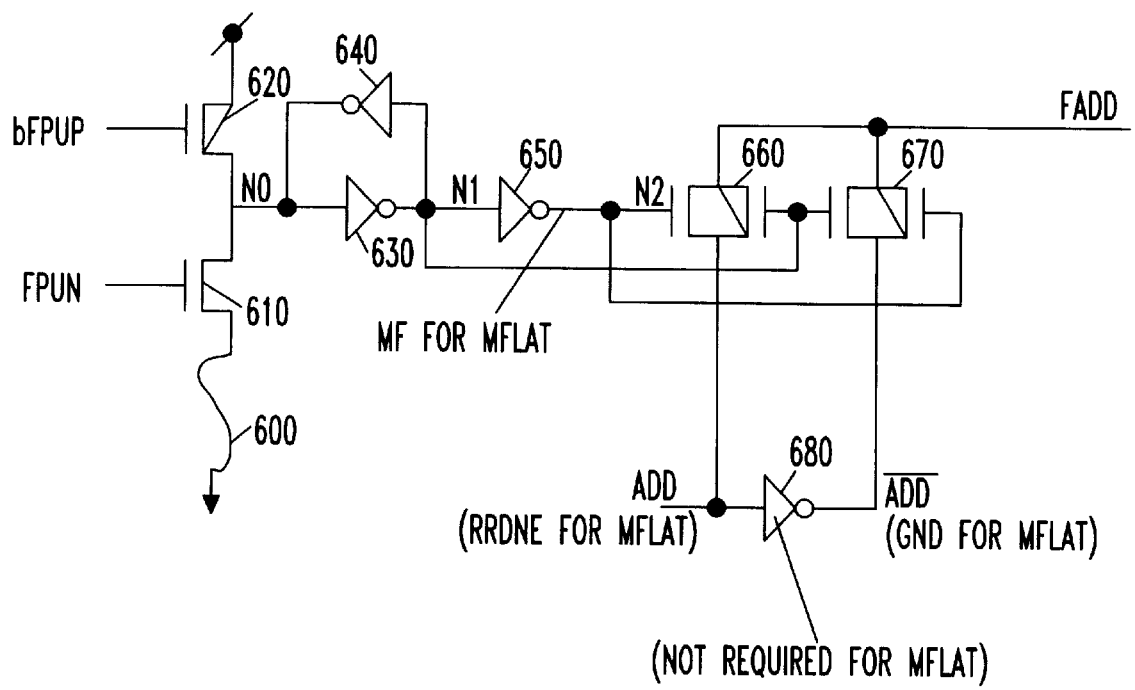
FIG. 6 shows a detailed gate level schematic of fuse latch FLAT and master fuse latch MFLAT.

FIG. 6 is a schematic diagram of a programmable fuse arrangement FLAT. It consists of an electrical (or laser) programmable fuse 600, fuse initialization devices 610 and 620, CMOS latches 630, 640, 650 and two CMOS pass gates 660 and 670. Either 660 or 670 opens, allowing FADD short-circuits to the node ADD or ADD bar inverted by the device 680. While the chip is being powered, signals bFPUP and FPUN remain at a low, which allows node N0 to be pre-charged. The signal bFPUP then rises permanently. Signal FPUN also rises, allowing node N0 to be coupled to fuse 600. When fuse 600 is not blown, then N0 and N1 fall and rise, respectively. This allows CMOS pass gate 670 to open, allowing FADD to follow ADD bar. When fuse 600 is blown, nodes N0 and N1 remain at a high and at a low level, respectively. This allows CMOS pass gate 660 to open, allowing FADD to follow ADD. In conclusion, when the fuse is not blown, a low ADD input switches the output of FADD to a high (i.e., programmed to 0) and a high ADD input makes the output of FADD remain at a low. When the fuse is blown, a high ADD input switches the output FADD to a high (i.e., programmed to 1) and a low ADD input allows FADD to remain at a low. By programming a fuse for the corresponding FLAT, a defective address can be identified for the redundancy replacement. The schematic of MFLAT is similar to the FLAT except for the CMOS pass gate 660 being coupled to line RRDNE, and CMOS pass gate 670 being coupled to ground.

While the present invention has been described in terms of various embodiments, other variations and modifications in the form of different memory configurations may come to mind to those skilled in the art without departing from the spirit and scope of the present invention. The invention should then be measured in terms of the claims that follow.

What is claimed is:

1. A method for repairing a memory device, the memory device having a plurality of primary arrays, said plurality of primary memory arrays having at least two domains, the method comprising the steps of:

determining after testing said memory device the number of faults within each of said domains;

providing a plurality of groups of redundancy units, said units having each at least one redundancy element;

assigning at least one of said redundancy groups to at least one of said two domains; and repairing faults contained within said assigned domain with said at least one of said redundancy units within said assigned redundancy group, wherein said redundancy groups are controlled by group control means.

2. The method according to claim 1, wherein said memory device is selected from the group consisting of a DRAM, an SRAM, a ROM, an EPROM, an EEPROM, a Flash RAM, and a CAM.

3. The method according to claim 1, further comprising domain selection means and redundancy unit selection means in each of said assigned domains.

4. The method according to claim 3, wherein said redundancy unit selection means within said assigned domain is controlled by said domain selection means.

5. The method according to claim 3, wherein said redundancy unit selection means is a redundancy control circuit.

6. The method according to claim 5, wherein said redundancy control circuit is enabled by said domain selection means.

7. The method according to claim 3, wherein said domain selection means is comprised of a plurality of fuse latches and a comparator.

8. The method according to claim 5, wherein said redundancy control circuit is comprised of a plurality of fuse latches, a master fuse latch, and a comparator.

9. The method according to claim 8, wherein said master fuse latch is controlled by said domain selection means.

10. The method according to claim 1, wherein said redundancy unit replaces defective elements within at least one of said two assigned domains.

11. The method according to claim 1, wherein at least two of said redundancy groups comprise a second plurality of said redundancy units which is different from a first plurality of said redundancy units.

12. The method according to claim 11, wherein said second plurality of redundancy units is comprised of said redundancy elements of different size.

13. A method for repairing a memory device provided with a selective domain redundancy replacement arrangement, the method comprising the steps of:

providing primary memory arrays, said primary memory arrays having at least two domains, each of said at least two domains including at least two sub-domains;

providing redundancy groups, each of said groups having at least two sub-groups;

assigning said redundancy groups to at least one of said two domains;

assigning said redundancy sub-groups within said assigned redundancy group to at least one of said sub-domains contained within said assigned domain; and repairing faults contained within said assigned sub-domain with said redundancy units contained within said assigned redundancy sub-groups.

14. A method for repairing a memory device provided with a selective domain redundancy replacement arrangement, the method comprising the steps of:

providing primary memory arrays, said primary memory arrays having at least two first domains and at least two second domains, each of said at least second domains comprising at least two sub-domains;

assigning first redundancy groups to at least one of said two first domains, each of said first redundancy groups comprising a plurality of first redundancy units;

repairing faults contained within said first domain with said first redundancy units contained within said assigned first redundancy groups;

providing second redundancy groups, each of said redundancy groups having at least two redundancy sub-groups;

assigning said redundancy sub-groups within said assigned second redundancy groups to at least one of said sub-domains in said assigned second domain; and repairing faults contained in said assigned sub-domain with said second redundancy groups, wherein said second redundancy groups comprise group control means.

15. A repairable memory device provided with a selective domain redundancy replacement arrangement, the memory device comprising:

primary memory arrays, each of said primary memory arrays having at least two domains;

means for assigning redundancy groups to at least one of said two domains, each of said redundancy groups comprising a plurality of redundancy units; and means for repairing faults within said domain with said redundancy units contained within said assigned redundancy groups.

16. The repairable memory device of claim 15, further comprising domain selection means and redundancy unit selection means in each of said assigned domains.

17. The repairable memory device of claim 16, wherein said redundancy unit selection means within said assigned domain is controlled by said domain selection means.

18. The repairable memory device of claim 16, wherein said said redundancy unit selection means is a redundancy control circuit.

19. The repairable memory device of claim 18, wherein said redundancy control circuit is enabled by said domain selection means.

20. The repairable memory device of claim 16, wherein said domain selection means is comprised of a plurality of fuse latches and a comparator.

21. The repairable memory device of claim 18, wherein said redundancy control circuit is comprised of a plurality of fuse latches, a master fuse latch, and a comparator.

22. The repairable memory device of claim 21, wherein said master fuse latch is controlled by said domain selection means.

23. The repairable memory device of claim 18, wherein said redundancy unit replaces defective elements within at least one of said two assigned domains.

24. The repairable memory device of claim 18, wherein at least two of said redundancy groups comprise a different number of said redundancy units.

25. The repairable memory device of claim 18, wherein said plurality of redundancy units are comprised of redundancy elements of different size.

26. A repairable memory device provided with a selective domain redundancy replacement arrangement, the memory device comprising:

primary memory arrays, said primary memory arrays having at least two domains, each of said at least two domains comprising at least two sub-domains;

a plurality of redundancy groups, each of said groups having at least two sub-groups and each of said at least two sub-groups having at least two redundancy units:

first means for assigning said redundancy groups to at least one of said two domains;

second means for assigning redundancy sub-groups within said assigned redundancy group to at least one of said sub-domains contained within said assigned domain; and means for repairing faults within said assigned sub-domain with redundancy units contained within said assigned redundancy sub-groups.

27. The repairable memory device of claim 26, wherein said at least two domains are of different size.

28. The repairable memory device of claim 26, wherein at least one redundancy group is comprised of a plurality of redundancy units.

29. The repairable memory device of claim 26, wherein said first assigning means hierarchically enable sub-groups within said groups.

30. The repairable memory device of claim 26, wherein said redundancy groups, said redundancy sub-groups and said redundancy units are shared among at least two of said domains.

31. A repairable memory device provided with a selective domain redundancy replacement arrangement, the memory device comprising:

primary memory arrays, said primary memory arrays having at least two first domains and at least two second domains, each of said at least two second domains comprising at least two sub-domains;

first means for assigning first redundancy groups to at least one of said two first domains, each of said first redundancy groups comprising a plurality of first redundancy units;

first means for repairing faults within said assigned first domain with said first redundancy units contained within said assigned first redundancy groups;

second redundancy groups, each of said second redundancy groups having at least two redundancy sub-groups, an each of said at least two redundancy sub-groups having at least two second redundancy units;

second means for assigning said second redundancy groups to at least one of said two second domains;

third means for assigning said redundancy sub-groups within said assigned second redundancy groups to at least one of said sub-domains in said assigned second domain; and second means for repairing faults within said assigned sub-domain with said second redundancy units in said assigned redundancy sub-groups.

32. The repairable memory device of claim 31, wherein said memory device is selected from the group consisting of a DRAM, an SRAM, a ROM, an EPROM, an EEPROM, a Flash RAM, and a CAM.

* * * * *